(12) United States Patent
Becker et al.

(10) Patent No.: US 9,543,979 B2
(45) Date of Patent: Jan. 10, 2017

(54) DATA TRANSMISSION METHOD FOR A BATTERY MANAGEMENT SYSTEM

(71) Applicants: Robert Bosch GmbH, Stuttgart (DE); Samsung SDI Co., Ltd., Yongin-si, Gyeonggi-do (KR)

(72) Inventors: Jens Becker, Stuttgart (DE); Christoph Brochhaus, Aachen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/109,613

(22) Filed: Dec. 17, 2013

(65) Prior Publication Data
US 2014/0180514 A1    Jun. 26, 2014

(30) Foreign Application Priority Data
Dec. 20, 2012   (DE) .................. 10 2012 224 060

(51) Int. Cl.
| | |
|---|---|
| H03M 7/30 | (2006.01) |
| G08C 13/00 | (2006.01) |
| G08C 19/02 | (2006.01) |
| B60W 20/00 | (2016.01) |
| G05B 13/02 | (2006.01) |
| H04L 12/40 | (2006.01) |

(52) U.S. Cl.
CPC .............. *H03M 7/30* (2013.01); *B60W 20/00* (2013.01); *G05B 13/02* (2013.01); *G08C 13/00* (2013.01); *G08C 19/02* (2013.01); *H03M 7/3059* (2013.01); *H04L 12/40* (2013.01); *Y10S 903/903* (2013.01)

(58) Field of Classification Search
None
See application file for complete search history.

(56) References Cited

U.S. PATENT DOCUMENTS

| | | | |
|---|---|---|---|
| 6,724,777 B1* | 4/2004 | Yamazaki | H04L 1/0007 370/470 |
| 2004/0027094 A1* | 2/2004 | Sanders et al. | 320/150 |
| 2006/0074605 A1* | 4/2006 | Williams | H03M 7/30 702/189 |
| 2007/0273491 A1* | 11/2007 | Recknagel et al. | 340/436 |

(Continued)

FOREIGN PATENT DOCUMENTS

| | | |
|---|---|---|
| DE | 103 33 989 A1 | 3/2005 |
| DE | 10 2004 001 293 A1 | 8/2005 |

(Continued)

*Primary Examiner* — Rami Khatib
*Assistant Examiner* — Jeffrey Boomer
(74) *Attorney, Agent, or Firm* — Maginot Moore & Beck LLP (57) ABSTRACT

A method for compressing measurement data which is transmitted from sensor control units via a data bus to a primary control unit of a battery management system for vehicles, includes transmitting a rate of change/slope of the measurement data to the primary control unit at a start of measurements. The method further includes transmitting deviations/differences in the measurement data from a current slope, and reconstructing, without loss of information, correct measured values from the rates of change/slope and the received deviations/differences with the primary control unit.

3 Claims, 4 Drawing Sheets

(56) References Cited

U.S. PATENT DOCUMENTS

| | | | |
|---|---|---|---|
| 2007/0299620 A1* | 12/2007 | Yun | B60L 11/1861 |
| | | | 702/63 |
| 2012/0076146 A1* | 3/2012 | Rohatschek et al. | 370/392 |
| 2012/0277970 A1* | 11/2012 | Rayl | F02D 35/023 |
| | | | 701/102 |
| 2014/0140400 A1* | 5/2014 | George | H04N 19/52 |
| | | | 375/240.12 |
| 2014/0172332 A1* | 6/2014 | Johnson et al. | 702/63 |
| 2015/0051855 A1* | 2/2015 | Joe et al. | 702/63 |
| 2015/0120225 A1* | 4/2015 | Kim | 702/63 |

FOREIGN PATENT DOCUMENTS

| | | |
|---|---|---|
| DE | 10 2010 041 427 A1 | 3/2012 |
| WO | WO 2005069276 A1 * | 7/2005 |

\* cited by examiner

DATA TRANSMISSION METHOD FOR A BATTERY MANAGEMENT SYSTEM

This application claims priority under 35 U.S.C. §119 to patent application no. DE 10 2012 224 060.8, filed on Dec. 20, 2012 in Germany, the disclosure of which is incorporated herein by reference in its entirety.

BACKGROUND

DE 103 33 989 A1 relates to a method for digital data transmission from a sensor to a control unit. Sensor values of a sensor are divided for data transmission at different resolutions. The sensor values form a first range of values having successive sensor values, in which the division of the first range of values for data transmission is carried out as a function of a variable relevant for the control unit. The variable is a second range of values of threshold values of a triggering algorithm for restraining means, the sensor values in the second range of values being transmitted from the sensor to the control unit at a higher resolution. The second range of values is in particular selected from the lower half of the first range of values.

DE 10 2004 001 293 A1 relates to an apparatus and method for data transmission with a reduced data volume. A method is proposed for sending multimedia data which is transmitted in time blocks, selection of at least one first time block being initially carried out as the basis for an extrapolation. Selection of at least one second time block of data which is to be estimated is then carried out, followed by sending the data in the at least one first time block and sending representative data for the extrapolation, which has a reduced data volume compared to the data which is to be estimated, during at least the second time block. DE 10 2004 001 293 A1 is also directed to a method for receiving multimedia data which is transmitted in time blocks, data initially being received in at least one first time block and representative data being received in at least one second time block. This is followed by the extrapolation of the data of the at least one second time block based on the data of the at least one first time block and the representative data.

Electronic control units are increasingly used today in the automotive sector in applications such as engine control units, ABS, airbag triggering systems, ESP, and the like. The development of a battery pack having an associated battery management system is required for vehicles which are equipped with an electric drive. A battery management system generally includes control units having software for monitoring the battery functionality. Depending on customer requirements or existing installation spaces, the topologies of battery packs vary widely with respect to the number of cells, modules, sensors, and so forth. Typical battery management systems ensure that cells and packs function safely and reliably. They monitor and control currents, voltages, temperatures, insulation resistances, and other variables for the cells and the entire battery pack. These variables make possible the implementation of the management functions which must be ensured by the battery management system, thus increasing the life span, reliability and safety of the battery system.

Battery management systems generally include a plurality of control units, on which individual software functions run. Depending on the number of cells, the number of sensors, and the distribution of the battery modules in various installation spaces in the automobile, a control unit topology results having a primary control unit and a plurality of subordinate sensor control units for detecting the measurement data directly at the individual battery modules. For example, the measurement data includes the voltages, temperatures, currents, and the like of the individual battery modules. The detected data is generally exchanged between the control units via a communication bus, for example, a CAN bus.

The use of a communication bus having a defined bandwidth limits the total data traffic which can be transported on the bus in a specified time interval. A low maximum bandwidth of the communication bus minimizes the probability of malfunctions caused, for example, by EMC irradiation. However, the use of a large number of battery modules and associated sensor control units makes it necessary to communicate all measurement data to the master control unit on the bus at a high frequency. The measurement frequency is therefore limited by the bandwidth of the communication bus and the number of battery modules.

SUMMARY

A method is proposed according to the present disclosure which makes use of a characteristic behavior of sensor data. Using the proposed method according to the present disclosure, it is possible to increase a maximum number of the sensor control units with lossless compression of the data transmission while maintaining a constant data bus bandwidth, and it is possible for more battery modules to communicate on the data bus without interference. The proposed method according to the present disclosure makes use of characteristic curves of sensor data. For example, the temperature of a battery module during ongoing operation rises gradually and levels off at a specific temperature value. For the proposed method according to the present disclosure, it is also possible to make use of the fact that the voltage which prevails in individual battery cells of a battery module generally falls during discharging and rises when charging the battery.

The two characteristic curves mentioned as examples may be used for the lossless compression of measurement data. The proposed method according to the present disclosure transmits the data from the sensor control unit to the primary control unit by carrying out the following method steps:

Transmission of a rate of change or slope of the measurement data at the start of the measurements, Transmission of the deviation of the measurement data from an assumed slope during each measurement cycle, Reconstruction of the correct measured values from the rate of change and the received deviation by the primary control unit without loss of information, Transmission of a new slope value if the slope changes by a defined value, and extrapolation of the measurement data.

Through the use of the proposed method according to the present disclosure of transmitting the deviations of the measured values, an internal vehicle communication bus, for example, the CAN bus which is generally used, is subjected to less bus loading, since these values, that is, the deviations of the measured values, require less bandwidth compared to the respective complete measured values.

In order to achieve compression of the data, the data transmission of the measured values is divided into two parts: the first part is determined by the transmission of the respective slope of the measured values. The second part is determined by extrapolating future measured values using the last measured value and the information about the slope. The deviation of the actual measured value from the extrapolated value is transmitted. Since the value range of the deviations is considerably smaller than the value range of the actual measured values, it is possible to conserve bandwidth without having to accept a loss in accuracy.

The first part, that is, the transmission of the slope of the measured values, may then be omitted if there is no change in the slope. It is thus in turn possible to conserve additional bandwidth on the communication bus, which is generally provided as a CAN bus. If necessary, that is, if certain threshold values are exceeded or if deviations of the extrapolated measured values from the actual measured values occur which are unacceptably high, the slope is ascertained again in order to prevent the extrapolated values from deviating too greatly from the measured values.

Method steps of the proposed method according to the present disclosure are described by way of example below with respect to the keywords: constant slope value, change in the sign of the slope, change in the steepness of the slope and reconstruction of the measured values. If the measured values which are taken at various measurement points have a constant slope value, that is, if the measurement data decreases or increases monotonically, the next measured value is extrapolated and a difference between the extrapolated value and the actual measured value is calculated. The extrapolated value results from the measured value and the slope. The same occurs with the remaining measured values. If the slope value is constant, the values of the difference of the third, fourth, and fifth measured values from the extrapolated values are relatively small, making it possible to conserve bandwidth on the bus, since in this example, the slope for all extrapolation operations is the same, and the transmission of the slope of the respective measured values may be omitted due to the constant slope value across the measurement points. This in turn results in conservation of bandwidth on the communication bus.

The following example relates to a change in the sign of the slope. If the slope of the measured values changes greatly, the slope must be adjusted in order to obtain a better approximation in the extrapolation operations. Only by doing this is it possible to keep the required bandwidth low on the communication bus, which is generally provided as a CAN bus in the vehicle. If, for example, a monotonically falling slope exists during three consecutive measurements and the sign of the slope changes its value, a new slope value is calculated, which is communicated over the communication bus. This new slope value is valid for all extrapolation operations as of the fourth measurement point. In addition to the communication of the measurement data in the form of the difference values, this results in a higher utilization of the communication bus between the third and fourth measurement points due to the transmission of the new slope value to the primary control unit. At this point and only at this point, is the bus loading temporarily increased.

If the slope changes its steepness only with respect to its magnitude, for example, measured values decrease to a lesser extent than previously, a new slope value is ascertained and transmitted as in the preceding example. Using this new value, the subsequent extrapolation operations are performed for the additional measurement points which lie after the adjustment of the slope value. In a manner similar to the second example described above, the transmission of the new slope value to the primary control unit causes a temporary increase in the bus loading of the communication bus at this instant.

In a fourth step, for example, the measured values are reconstructed. The reconstruction of the real measured values is carried out within the primary control unit through extrapolation. The extrapolation of the new measured value is carried out with the aid of the preceding measured value taking into consideration the instantaneous slope and the transmitted measured value difference.

The compelling advantage of the proposed method according to the present disclosure for transmitting measured values is that only the difference values from the extrapolated measured values are respectively transmitted, resulting in a lower bandwidth requirement on the data bus. Unlike the simple transmission of difference values, by using the slope, only very small differences are transmitted, even for constantly rising or falling measured values. When transmitted on the communication bus, these small differences may be represented by a data type having a smaller number of bits, thus conserving bandwidth on the communication bus, which is generally designed as a CAN bus in a vehicle.

The extrapolation and the correction of measured values are carried out using simple addition and subtraction steps. The correct measured value m is reconstructed from the last measured value x and the instantaneous slope (dx) and the measured deviation d according to the following relation:

$$m=x+dx+d$$

Using the proposed method according to the present disclosure, it is possible to achieve a reduction in the bandwidth of the data bus. As a result, the data bus is used to a lesser extent and is therefore less susceptible to malfunction.

This in turn makes it possible to connect multiple sensors to the data bus, that is, to the communication bus. A lower level of bus loading enables the additional communication of additional sensor control units on the bus. It is thus possible to increase the total number of components, in the following case, sensor control units, to be connected to each other via the communication bus while being able to maintain the bandwidth. The proposed method according to the present disclosure causes no loss in accuracy since the communication bus ensures loss-free transmission.

BRIEF DESCRIPTION OF THE DRAWINGS

The disclosure is described in greater detail with the aid of the drawings.

The following are depicted.

DETAILED DESCRIPTION

Figure 1:
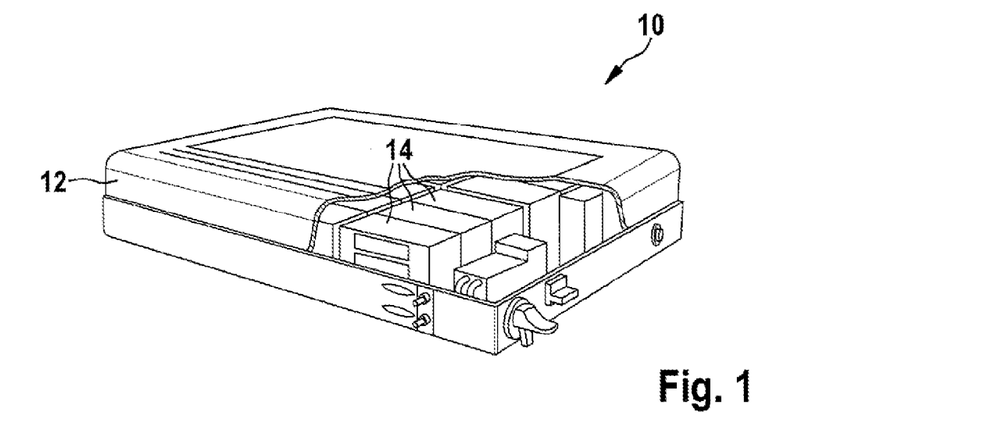
FIG. 1 shows the exemplary illustration of a battery pack.

The illustration according to FIG. 1 shows a battery pack which is depicted as partially cut away.

A battery pack 10, in which a number of battery modules 14 are accommodated which are connected to each other, is enclosed by a housing 12. To illustrate the interior of the battery pack 10, the housing 12 is partially cut away in the illustration according to FIG. 1. A number of battery modules 14, sensor control units, and the like are located in the interior of the battery pack 10, which are required for operating the battery pack 10.

Figure 2:
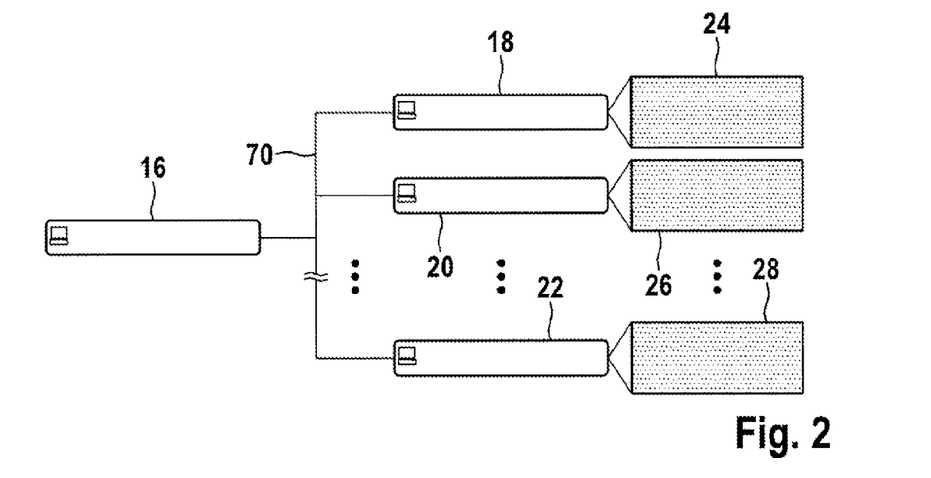
FIG. 2 shows the schematic structure of a battery management system having multiple battery modules, multiple sensor control units, and a primary control unit.

FIG. 2 schematically illustrates the structure of a battery management system.

A battery management system includes a primary control unit 16 and a number of sensor control units. In the exemplary illustration according to FIG. 2, a first sensor control unit 18, a second sensor control unit 20, and an nth control unit 22 are depicted. Each of the sensor control units 18, 20, and 22 is associated with a separate battery module. The first sensor control unit 18 thus monitors the first battery module 24, the second sensor control unit 20 monitors the second battery module 26, and the nth sensor control unit 22 monitors the nth battery module, compare item 28. For reasons of simplification, the other control units and battery modules which are operated via the battery management system are not reproduced in the illustration according to FIG. 2.

Battery management systems according to the illustration in FIG. 2 ensure the safe and reliable function of the cells and battery pack 10. Management systems of this kind monitor and control currents, voltages, temperatures, insulation resistances, and other variables for the cells and the entire battery pack 10, as illustrated in FIG. 1. The current, voltage, temperature, and insulation resistance variables and the like can be used to implement management functions which increase the lifetime, reliability, and safety of the battery system. Battery management systems include a plurality of control units 18, 20, 22, on which individual software functions run. Depending on the number of cells, the number of sensors, and the distribution of the battery modules 24, 26, 28 across various installation spaces within the automobile, a control unit topology results including the primary control unit 16 and a plurality of these subordinate sensor control units 18, 20, 22, as depicted in FIG. 2. Measurement data, for example, voltages, temperatures, and currents, is detected directly at the individual battery modules 24, 26, 28 with the aid of the sensor control units 18, 20, 22. The detected data is exchanged between the control units 16, 18, 20, 22 via a communication bus 70, which is generally embodied as a CAN bus.

The proposed method according to the present disclosure for operating a battery management system and the battery management system enable loss-free compression during data transmission and the communication of a maximum number of sensor control units 18, 20, 22 while maintaining a constant data bus bandwidth. More battery modules 24, 26, 28 are able to communicate on the data bus without malfunction to the greatest possible extent. The proposed method according to the present disclosure makes use of characteristic curves of sensor data.

Figure 3:
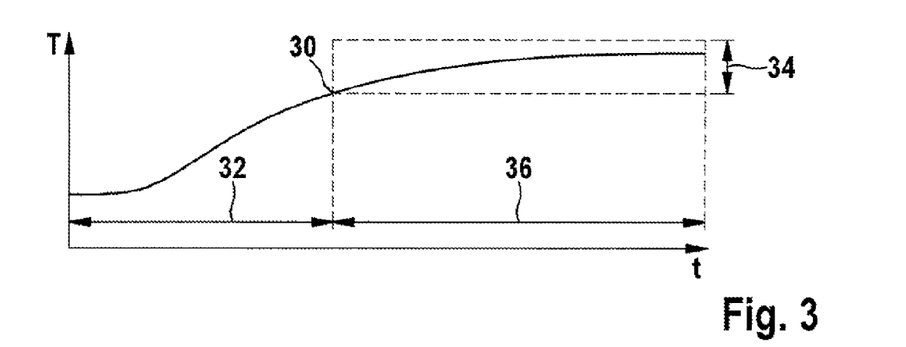
FIG. 3 shows the curve of the temperature of a battery during ongoing operation.

FIG. 3 depicts the curve of the temperature of the battery over time.

FIG. 3 shows that a curve 30 of the battery temperature may be essentially characterized by sections. During a rising phase 32, the battery temperature increases continuously until temperature stability 36 occurs. During ongoing operation of the battery or the battery pack 10, the curve 30 of the battery temperature remains stable and moves only slightly upward within a fluctuation interval 34. The proposed method according to the present disclosure makes use of this characteristic curve of the temperature, as well as the curve of the cell voltage of the battery pack 10 plotted on the time axis illustrated in FIG. 4.

Figure 4:
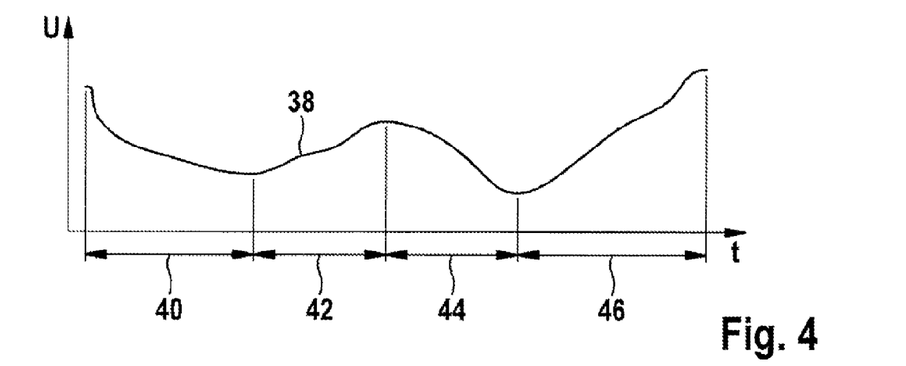
FIG. 4 shows the curve of the battery cell voltage during discharging and charging.

FIG. 4 shows that a curve of the battery cell voltage 38 essentially follows discharge and charge cycles. During a first discharge process 40, the battery cell voltage 38 naturally decreases, and during a first charge process 42 following the first discharge process 40, the battery cell voltage 38 increases again, only to decrease again in a second discharge process 44. A second charge process 46 follows the second discharge process 44, during which the battery cell voltage rises again according to the illustration in FIG. 4.

Following the proposed method according to the present disclosure, the data transmission of the measured values is divided into two parts in order to compress the data. The first part of the division is constituted by a transmission of the slope/rate of change of the measured values being carried out. In a second part of the data transmission, future measured values are extrapolated from the last measured value and the current information about the slope. The deviation of the actual measured value from the extrapolated value is transmitted to the primary control unit 16. Since the value range of the deviations is considerably smaller than the value range of the actual measured values, it is possible to conserve the bandwidth of a communication or data bus without loss of accuracy. The first part of the data division, that is, the transmission of the rising measured values, may therefore be omitted if there is no change in the slope or the rate of change of the measured values. It is thus possible to conserve more, that is, additional bandwidth on the data bus. However, if necessary, the slope is determined again and is also retransmitted to the primary control unit in order to prevent the extrapolated values from deviating too greatly from the measured values; in other words, an approximation is no longer available.

The measurement data is transmitted from the respective sensor control units 22, 24, and 26 to the primary control unit 16 of the battery management system according to the following curve:

As described above, in a first step, at the start of the measurement, the rate of change/slope of the measurement data is transmitted via a data bus 70 to the primary control unit 16.

In addition, the deviation of the measurement data from the current slope is transmitted via the data bus within each measurement cycle, which occurs at discrete measurement points 52, 54, 56, 58, 60, 62, 64. In a third step, the data receiver, in this case, the primary control unit 16, constructs the correct measured values from the rate of change/slope and the deviations received via the data bus 70. This reconstruction occurs without loss of accuracy.

If there is a change in the rate of change or the slope by a defined value, a new slope value is ascertained, with which the measurement data is then subjected to an extrapolation 92 in the primary control unit 16 in order to improve the approximation.

The rate of change or slope and the deviation of the measurement data from the assumed slope are transmitted on the data bus 70 under only partial bus utilization 72 via the deviations or difference values and the information about the slope, so that only a portion rather than the total bandwidth of the data bus 70 continues to be used, and sufficient unused bus capacity 74 remains which may be used for other purposes. By transmitting the deviation/ differences 68 of the measured values, less bus loading is required, since these values require less bandwidth with respect to the use of the data bus 70 compared to the full measured values, which would utilize substantially more bus capacity on the data bus 70.

The proposed method according to the present disclosure is described using the following examples as shown in FIGS. 5 to 8.

Figure 5:
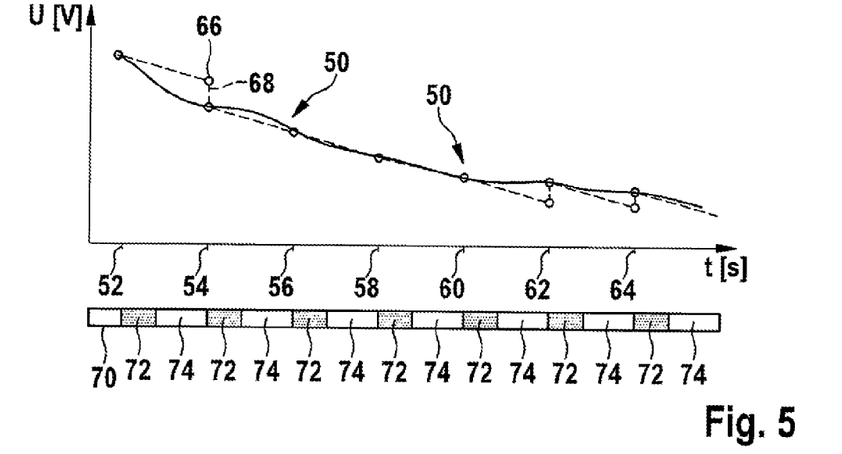
FIG. 5 shows a reconstruction of measured values having recourse to rates of change/slope and difference values of measured values and a data bus which is illustrated by way of example.

FIG. 5 shows the reconstruction of the measured values from the slope or rate of change of the measured values.

In FIG. 5, the cell voltage U of one of the battery cells of a battery module 14 of the battery pack 10 is plotted over time. Measured data is taken at discrete measurement points 52, 54, 56, 58, 60, 62, 64. As shown in the illustration according to FIG. 5, the respective measured values taken at the measurement points 52 to 64 have a constant monotonically falling slope 50 in this example. The slope 50 was ascertained based on two or more previously taken measured values and was already transmitted via the data bus 70 to the primary control unit 16. An extrapolated value 66 is calculated in the primary control unit 16 from the measured value taken at the first measurement point 52. At a second measurement point 54, a measured value is ascertained which has a difference or deviation 68 from the previously ascertained extrapolated value 66. The extrapolated value 66 results from the first measured value taken and the information about the respective current slope of the measured values. The illustration according to FIG. 5 shows that the measured values ascertained at the third measurement point 56, the fourth measurement point 58, and the fifth measurement point 60 have a very small deviation or difference 68 from the associated extrapolated values. Only this information, that is, the deviation or difference 68, is transmitted on the data bus 70. At the start of the respective measurement cycles, which begin at the discrete measurement points 52, 54, 56, 58, 60, 62, 64, the data bus 70 carries a partial bus utilization 72 including those difference or deviation values 68 with respect to the extrapolated values 66. The smaller the deviations, the lower the bus utilization 72 which is required.

The illustration according to FIG. 5 also shows that in this case, the slope 50 is the same for all extrapolation operations 92. At each point, only deviation or difference values 68 are transmitted under a partial bus utilization 72 of the data bus 70, so that unused bus capacity 74 remains on the data bus 70, as indicated in the illustration of the data bus 70 according to FIG. 5.

Figure 6:
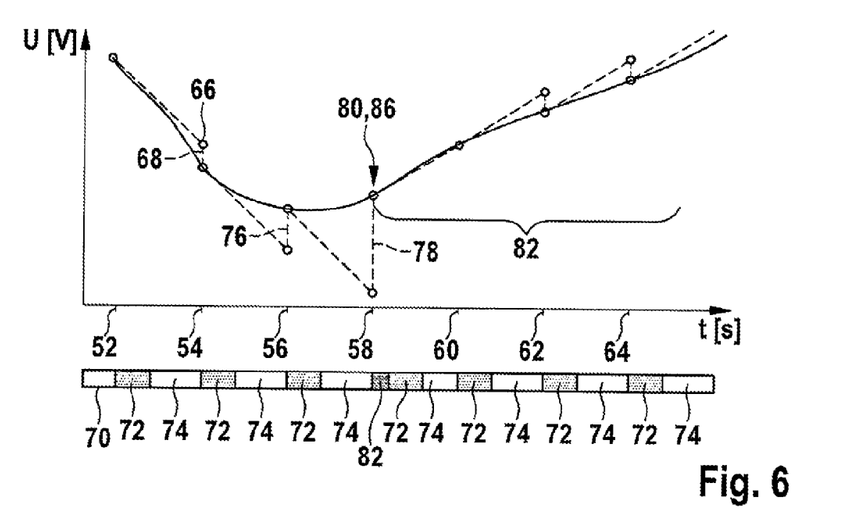
FIG. 6 shows a change in the slope curve of a measured value curve and a bus utilization of a communication data bus with differences/deviations and information about a new slope value.

The illustration according to FIG. 6 shows a curve of the battery cell voltage which is also plotted on the time axis, in which a change of sign of the slope or the rate of change results during this series of measurements.

In a manner similar to the illustration according to FIG. 5, a measurement cycle is initiated at each discrete measurement point 52, 54, 56, 58, 60, 62, and 64. FIG. 6 shows that the slope of the measured values changes. If the deviation 68 from the extrapolated value 66 at the second measurement point 54 is still within bounds, the deviation of the extrapolated value at the third measurement point 56 and the fourth measurement point 58 increases, compare items 76 and 78. Up to the third measurement point 56, the extrapolation is carried out using an original slope value. Between the measurement points 56 and 58, there is a change in the sign 86 of the slope. The third deviation ascertained at the fourth measurement point 58 with respect to the extrapolated value 66 is unacceptably high and no longer constitutes a reasonable approximation. A new calculation, that is, an adjustment 80 of the slope, is now carried out in the primary control unit 16. In addition, at the fourth measurement point 58, a transmission of a new slope value 82 is carried out, which is used for future extrapolations via the bus. At the start of the fourth measurement cycle, that is, at the fourth measurement point 58, there is therefore a temporary increase in bus loading due to transmission of the new slope values 82 under the partial bus utilization 72. The illustration according to FIG. 6 also shows that in a manner similar to the illustration according to FIG. 5, a relatively large unused bus capacity 74 remains, since only deviations 68 or differences from extrapolated values are transmitted. The smaller the deviations or differences 68, the lower the resulting partial bus utilization 72. The illustration according to FIG. 6 also shows that the deviations 76, 78 ascertained here at the third and fourth measurement points 56 and 58 no longer constitute a reasonable approximation.

Figure 7:
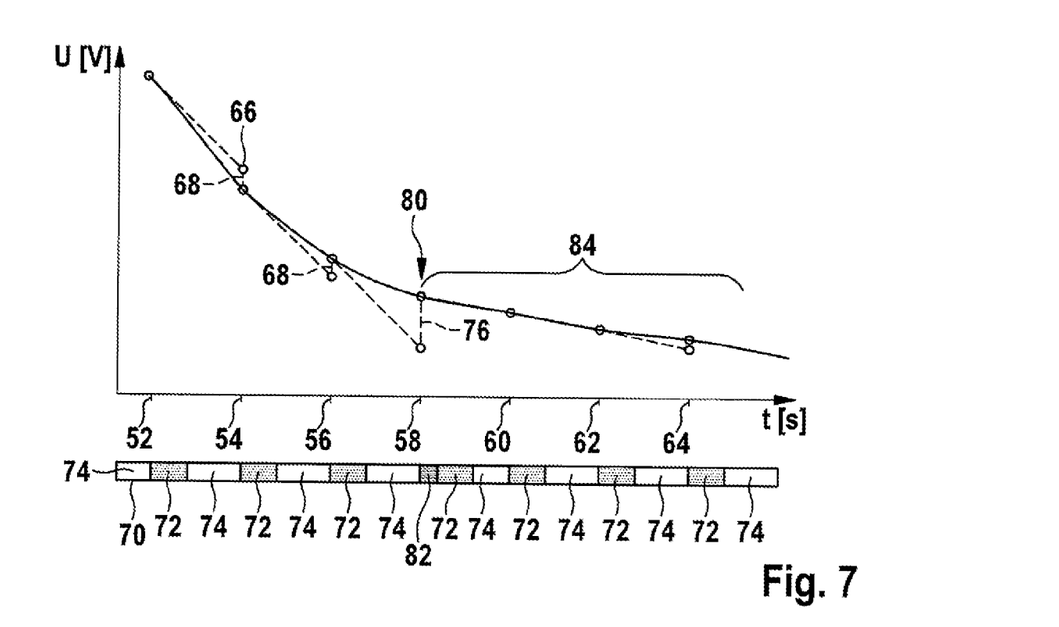
FIG. 7 shows an adjustment of the slope of a series of measured values and a resulting partial data bus utilization of a communication bus taking into consideration unused bus capacity.

The example according to FIG. 7 shows a change in the slope during a series of measurements.

In this example, the battery cell voltage is also plotted on the time axis. Starting at a first measurement point 52, measurement cycles at the respective additional measurement points 54, 56, 58, 60, 62, and 64 are initiated along the time axis. From an initial value, an extrapolated value 66 is ascertained from the current slope and the initial measured value. The current slope was ascertained based on earlier measured values. The deviation or difference 68 from the extrapolated value 66 at the second measurement point 54 is small, which is also true for the deviation or difference 68 at the third measurement point 56. As shown in FIG. 7, the slope then changes, that is, the individual measured values decrease more slowly than in the measurements made at the first, second, and third measurement points before the fourth measurement point 58. This means that at the start of the fourth measurement cycle, that is, at measurement point 58, an adjustment 80 of the slope is carried out, since the second deviation or difference at this point is unacceptably large compared to the deviations or differences 68 at the second measurement point 54 and at the third measurement point 56. In a manner similar to the illustration according to FIG. 6, at the start of the fourth measurement cycle, that is, at the fourth measurement point 58, a new slope value is ascertained and transmitted via the data bus 70, indicated by the new slope value 82, which is placed on the data bus 70 under only partial bus utilization 72 at the start of the fourth measurement cycle, that is, at the fourth measurement point 58. The following extrapolations of the measured values are performed in the primary control unit 16 using this new value for the slope, that is, the new slope value 82. The range of the series of measurements is indicated by reference number 84, which is ascertained after the adjustment 80 using the adjusted slope value and which is taken as a basis for the extrapolation operations 92.

Figure 8:
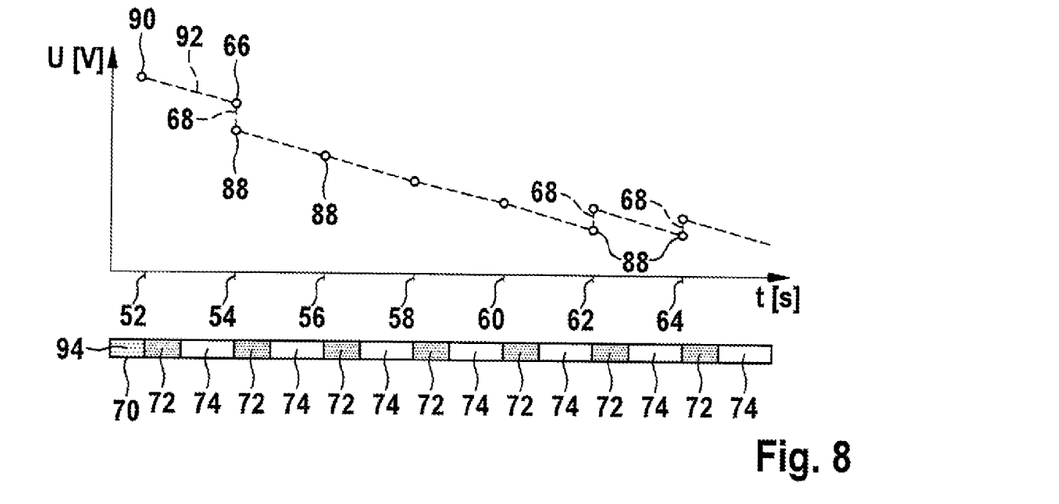
FIG. 8 shows a possible reconstruction of measured values having recourse to difference values slope information, the data transmission to the primary control unit being carried out via a partially utilized data bus.

FIG. 8 shows a reconstruction of the real measured values by the primary control unit 16 of the battery management system.

Here as well, the battery cell voltage U is plotted over the time axis t. Starting from an initial value 90, an extrapolation operation 92 is carried out in the primary control unit 16, the result of which is the extrapolated value 66. Reference number 88 designates a reconstructed measured value, which differs by a deviation or difference 68 from the extrapolated value 66. The reconstruction of the real measured values, that is, the reconstructed measured values 88, is carried out in the primary control unit 16 through extrapolation 92 of the new measured value with the aid of the preceding measured value and the instantaneous slope and the measured value deviation or measured value difference 68 transmitted via the data bus 70. The primary control unit 16 calculates the reconstructed measured values using the slope information 74 placed on the data bus 70 and the partial bus utilization 72, that is, the utilization of the data bus 70 having the deviations difference values 68. The ascertainment is carried out at each of the discrete measurement points 52, 54, 56, 58, 60, 62, 64, which are plotted on the time axis according to FIG. 8.

The method for compressing data described above, in particular, with the aid of FIGS. 5, 6, 7, and 8, enables the reconstruction of a correct measured value m taking into consideration the last measured value x, the instantaneous slope dx, and the measurement deviation d according to the equation m=x+dx+d. The use of the data bus 70 is considerably more economical, since only difference values 68 from the extrapolated measured values 66 are transmitted. This results in a reduced bandwidth requirement on the data bus. Unlike simple transmission of difference values or deviations 68, the use of the respective slope even for constantly rising or falling measured values causes only very small differences to be transmitted via the data bus 70 by way of a partial bus utilization 72, thus also conserving bandwidth on the communication bus, for example, a CAN data bus, as it is installed in the vehicle. The data bus 70 is utilized only to a small extent according to the partial bus utilization 72 and is therefore less susceptible to malfunction.

In addition, when implementing the proposed method according to the present disclosure for operating a battery management system, it is possible to supply more sensors via the data bus. Lower bus loading allows additional sensor control units to communicate on the bus, making it possible to increase the total number of sensor control units which communicate via the data bus 70 while maintaining a constant data bus bandwidth. In addition, there is advantageously no loss in accuracy when reconstructing the data, since loss-free transmission is ensured.

What is claimed is:

1. A method for compressing measurement data which is transmitted from a sensor control unit via a data bus to a primary control unit of a battery management system for a vehicle, comprising:
    operating a sensor with the sensor control unit to measure the measurement data, the measurement data including a series of data over time;
    transmitting the measurement data from the sensor control unit to the primary control unit via the data bus, the transmitting of the measurement data comprising:
        periodically calculating a slope of the measurement data with the sensor control unit;
        transmitting, at the start of the transmitting of the measurement data, (i) a first measurement datum of the measurement data and (ii) a most recently calculated slope of the measurement data from the sensor control unit to the primary control unit via the data bus;
        calculating with the sensor control unit, for each measurement datum of the measurement data that is subsequent in time to the first measurement datum, a deviation from an extrapolated value based on a previous value and a most recently transmitted slope of the measurement data; and
        transmitting, for each measurement datum of the measurement data that is subsequent in time to the first measurement datum:
            only the deviation of the respective measurement datum of the measurement data from the sensor control unit to the primary control unit via the data bus in response to a difference between a most recently calculated slope of the measurement data and a most recently transmitted slope of the measurement data being less than a predefined threshold; and
            both the most recently calculated slope of the measurement data and the deviation of the respective measurement datum of the measurement data from the sensor control unit to the primary control unit via the data bus in response to the difference between the most recently calculated slope of the measurement data and the most recently transmitted slope of the measurement data being greater than the predefined threshold; and
    reconstructing each measurement datum of the measurement data that is subsequent in time to the first measurement datum based on the most recently transmitted slope of the measurement data and the deviation of each respective measurement datum with the primary control unit,
    wherein the transmitting of both the most recently calculated slope of the measurement data and the deviation of a respective measurement datum of the measurement data uses a temporarily larger portion of a maximum bandwidth of the data bus as compared to a portion of the maximum bandwidth of the data bus that is used when only transmitting the deviation of the respective measurement datum of the measurement data.

2. The method according to claim 1, the reconstructing of the measurement data further comprising:
    extrapolating, for each deviation transmitted from the sensor control unit to the primary control unit, a next measured value using the received slope and a previous corrected measured value; and
    correcting, for each deviation transmitted from the sensor control unit to the primary control unit, the next measured value by summing a corresponding received deviation with the extrapolated next measured value.

3. The method according to claim 1, wherein the transmitting of the deviation of each measurement datum of the measurement data uses a partial amount of a maximum bandwidth of the data bus.

\* \* \* \* \*